United States Patent [19]
Mambo

[11] Patent Number: 5,669,067
[45] Date of Patent: Sep. 16, 1997

[54] REMOTELY CONTROLLABLE VARIABLE INTERMEDIATE FREQUENCY TRANSCEIVER

[75] Inventor: Philip Mambo, Dorval, Canada

[73] Assignee: Harris Corporation, Melbourne, Fla.

[21] Appl. No.: 267,435

[22] Filed: Jun. 29, 1994

[51] Int. Cl.⁶ .................................................. H04B 1/40
[52] U.S. Cl. .................................... 455/76; 455/86
[58] Field of Search .................... 455/78, 84, 76, 455/73, 82, 83, 86

[56] References Cited

U.S. PATENT DOCUMENTS

| | | | |
|---|---|---|---|
| 2,447,392 | 8/1948 | Byrne . | |
| 2,974,222 | 3/1961 | Lawson | 455/84 |
| 4,186,344 | 1/1980 | Higuchi et al. . | |
| 4,197,498 | 4/1980 | Fukui et al. | 455/78 |
| 4,263,676 | 4/1981 | Liebel | 455/311 |
| 4,476,575 | 10/1984 | Franke et al. . | |
| 4,520,474 | 5/1985 | Vilmur . | |
| 4,531,232 | 7/1985 | Sakurai | 455/352 |
| 4,907,291 | 3/1990 | Yamamoto | 455/86 |
| 4,932,072 | 6/1990 | Toko | 455/76 |
| 5,010,584 | 4/1991 | Seki . | |
| 5,175,872 | 12/1992 | Borras | 455/76 |
| 5,335,364 | 8/1994 | Heinonen | 455/76 |

*Primary Examiner*—Edward F. Urban
*Attorney, Agent, or Firm*—Rogers & Killeen

[57] ABSTRACT

A transceiver and method of tuning a transceiver having a remote unit and a local unit. The remote unit includes a modulation section having a transmit frequency synthesizer and a receive frequency synthesizer and a frequency conversion section having a fixed frequency local oscillator, a transmit mixer and a receive mixer. The transceiver may be tuned by remotely controlling the synthesizers to select the frequency and/or data to be transmitted and the frequency and/or data to be received.

15 Claims, 1 Drawing Sheet

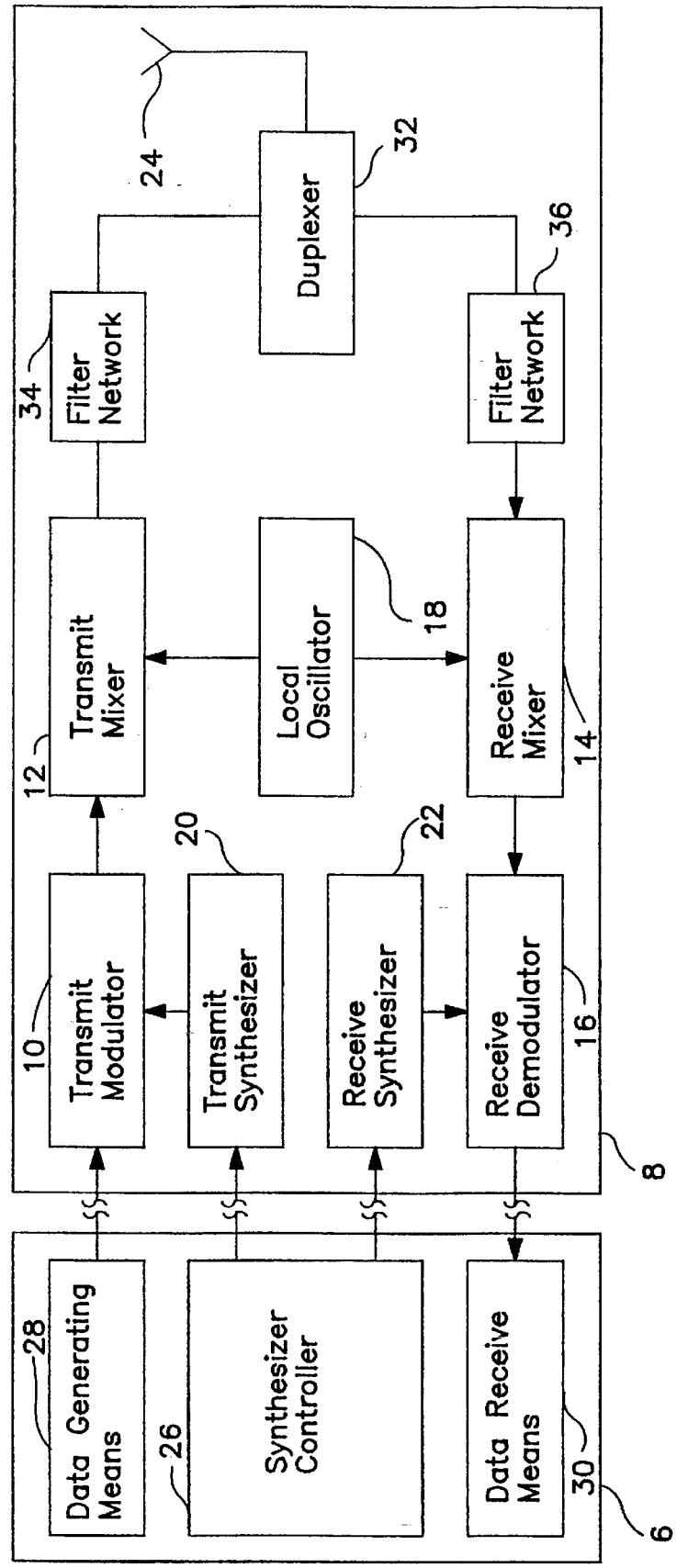

REMOTELY CONTROLLABLE VARIABLE INTERMEDIATE FREQUENCY TRANSCEIVER

BACKGROUND OF THE INVENTION

The present invention relates to a transceiver and a method of tuning a transceiver. More particularly, the present invention relates to a device and method for tuning a transceiver at the modulation section while the local oscillator at the frequency conversion section remains fixed.

Many modern communication systems include antennas with transmitter/receiver devices (transceivers) for simultaneously transmitting and receiving independent radio frequency (RF) signals. When the RF signal being transmitted or received has a carrier signal with a high frequency, i.e., greater than 1 GHz, it is often particularly desirable for the transceiver to be a physically located close to the feed of the antenna. High frequency RF signals may lose considerable signal strength and/or suffer interference when they are carried from the antenna to a remote transceiver. Hence, a physically proximity between the antenna and the transceiver is often desirable.

Generally, in high frequency transceivers, the data being transmitted (which may be voice, digital data, etc.) is baseband data which is modulated up to the carrier frequency in a two or three stage process. In the first one or two stages, the baseband data to be transmitted is modulated to an intermediate frequency ("IF"); then, in the last stage, the IF signal is up converted to an RF signal which may be amplified and applied to the antenna (through a conventional antenna coupling) for broadcast. In the case of a received signal, the sequence of steps is reversed.

In most communication systems, it is desirable to be able to use a single transceiver for the transmission/receipt of differing RF signals having a range of carrier frequencies. Thus, the transceiver is able to communicate on a number of "channels" in the RF spectrum. Indeed, in some applications, e.g., in frequency hopping systems, it is desirable that a single communication utilize on a succession of carriers having different center frequencies. In order to be able to "tune" the transceiver to a range of carrier frequencies, it is known to use the modulator section of the transceiver to modulate the baseband data to a predetermined IF frequency and to vary the frequency of the up converter (or down converter) to produce the range of desired carrier frequencies. Generally, the circuits needed to perform a variable (or selective) conversion are considerably more complex and contain significantly more components than do circuits which are capable of up converting by a single frequency. For example, components (e.g., filters, amplifiers, etc.) used in such circuits may require additional bandwidth capability and must operate over a range of conditions. Moreover, circuits which operate at a very high frequency (such as 1 GHZ) tend to be much more expensive, more difficult to maintain, and more susceptible to external interference than circuits which operate at IF frequencies. Accordingly, in terms of general cost and complexity, communication systems in which the complex circuits operate in the IF range are desirable.

Some prior art transceivers have one conversion section for down-converting a received RF signal to an IF signal and for up-converting an IF signal to the RF regime. Transceivers having only one conversion section may have a separate local oscillator for the transmit path and a separate local oscillator for the receive path or they may have a single local oscillator serving both the transmit and the receive paths.

The transceiver apparatus disclosed in Yamamoto U.S. Pat. No. 4,907,291 include a transceiver unit having a conversion section and a separate main unit having a modulation section. The transceiver unit is located at the feed of the antenna and the main unit is located some distance away from the transceiver unit. The transceiver unit and the main unit are separate devices connected by a single RF cable and therefore each unit requires a multiplexing scheme for transmitting and receiving their respective signals. Moreover, the signal transmitted between the main and transceiver units is at a very high frequency, exceeding 1 GHz. A problem is that because the conversion stage is located in the main unit and the modulation stage is located in the transceiver unit, relatively high frequency signals are passed between the units thereby increasing the signal attenuation due to cable loss and the complexity of the equipment needed to handle the signals.

Yet a further problem is that the increased signal attenuation must be compensated with higher gain amplifiers which complicates the overall design of the system and increases cost.

It is accordingly an object of the present invention to provide a novel method and apparatus for transmitting and receiving independent RF signals having a range of carrier frequencies wherein frequency conversion is performed at relatively low frequency levels.

It is a further object of the present invention to provide a novel method and apparatus for transceiving RF signals which has a relatively low cost due to reduced component counts and circuit complexity.

It is yet a further object of the present invention to provide a novel method and apparatus for transceiving RF signals without complicated frequency multiplexers.

It is still another object of the present invention to provide a novel method and apparatus for transceiving RF signals where the signal received and the signal transmitted are remotely controlled.

It is still another object of the present invention to provide a novel method and apparatus for transceiving RF signals in which the signals passed through cables are kept relatively low in frequency.

These and other objects of the present invention will become apparent to those skilled in the art from a review of the following specification in conjunction with the drawing figures when accorded a full range of equivalents.

BRIEF DESCRIPTION OF THE DRAWINGS

FIG. 1 is a schematic of one embodiment of the transceiver of the present invention.

DESCRIPTION OF PREFERRED EMBODIMENTS

With reference to FIG. 1, a transceiver in accordance with the invention may include a local unit 6 and a remote unit 8. The remote unit 8 may include a transmit path having a transmit modulator 10 and a transmit mixer 12 and a receive path having a receive mixer 14 and a receive demodulator 16. The remote unit may also include a local oscillator 18 which provides a carrier signal for the transmit mixer 12 and the receive mixer 14, a transmit synthesizer 20 which provides a transmit modulation signal of modulation frequency for the transmit modulator 10 and a receive synthesizer 22 which provides a receive demodulation signal of demodulation frequency for the receive demodulator 16.

The local unit 6 may include a synthesizer controller 26 for controlling the receive and transmit synthesizers 20 and 22, data generating means 28 for generating transmit data and data receiving means 30 for receiving receive data.

An antenna 24 may be provided for receiving a receive signal and transmitting a transmit signal and a duplexer 32 is provided for coupling the transmit and receive signals to the antenna 24. Conventional filters and amplifiers 34, 36 may be interposed along the transmit and receive signal paths as is well known in the art.

In operation, an RF signal may be received by the antenna 24 and is provided through the duplexer 32 and filters and amplifiers 36 to the receive mixer 14. The signal received at the receive mixer 14 is mixed (or multiplied) by the receive mixer 14 with a local generated signal from the local oscillator to down convert the receive signal to an intermediate receive signal. The intermediate receive signal may then be demodulated at the receive demodulator 16 by mixing the intermediate receive signal with the demodulation signal (from the receive synthesizer 22) to produce a receive data signal in the IF range. The receive data signal contains selected receive data which can be changed by selectively varying the demodulation frequency of the demodulation signal.

The receive data signal may then be sent by any conventional means (cable, multiplexer, etc.) to the local unit 6 which may perform a further demodulation to baseband and may further decode or process the data contained within the signal.

In one embodiment, the receive signal may have a frequency in the order of 10 GHz; the intermediate receive signal may have a frequency in the order of 1 GHz; and, the receive data signal may have a frequency in the order of 70 MHZ.

With continued reference to FIG. 1, a data signal to be transmitted may be generated in any conventional manner or received from other devices at the local unit 6. The data generator means 28 may modulate the data to provide a transmit data signal, an IF signal, which can be sent by conventional means to the remote unit 8, particularly the transmit modulator 10 thereof. The transmit data signal is modulated at the transmit modulator 10 by mixing the transmit data signal with the modulation signal derived from the transmit synthesizer 20 to produce an intermediate transmit signal. The intermediate transmit signal may then be up-converted at the transmit mixer 12 by mixing the intermediate transmit signal with the carrier signal from the local oscillator 18 to produce a transmit signal which may then be filtered, amplified and transmitted via the antenna 24. The transmit signal contains selected transmit data which can be changed by selectively varying the modulation frequency of the modulation signal.

In the preferred embodiment, the transmit synthesizer 20 and the receive synthesizer 22 are remotely controlled by a synthesizer controller 26 located in the local unit 6. By remotely controlling the transmit and receive synthesizers 20 and 22, a user can selectively vary the modulation frequency and the demodulation frequency to thereby selectively change the selected transmit data on the transmit signal and the selected receive data on the receive signal. In this way, even though the frequency of the carrier signal is fixed, the user can selectively change the data to be transmitted (or its frequency) and the data to be received. The synthesizer controller may be any known conventional means of remotely controlling a synthesizer.

The transmit data signal and the receive data signal are low frequency signals that do not experience a significant amount of attenuation between the local unit 6 and the remote unit 8. The local unit 6, therefore, is capable of being located a greater distance from the remote unit 8 which provides a great advantage to remote communication systems. In a preferred embodiment, the frequency of the transmit data signal and the receive data signal may be about 70 Mhz.

The frequency of the intermediate transmit signal and the intermediate receive signal are relatively high with respect to the transmit signal and the receive signal such that the image responses and the carriers are moved out of band thereby reducing interference. In a preferred embodiment, the frequency of the intermediate signals may be about 1 Ghz.

In a preferred embodiment, the frequency of the intermediate signals is relatively high and, accordingly, the filters and amplifiers can be wide-band, which reduces attenuation and simplifies the tuning of the filters. Because the local oscillator 18 may be fixed in frequency and because the filters can be wide-band, there is no need to replace or tune the filters and amplifiers when tuning the transceiver with the synthesizers 20 and 22.

While the local unit 6 may include data generating means 28 for generating the transmit data and data receiving means 30 for receiving the receive data, it is not necessary that the data generating means 28 and the data receiving means 30 be located in the local unit 6, nor is it necessary that the data generating means 28 and the data receive means 30 be located in the same unit as the synthesizer controller 26. Furthermore, the data generating means 28 can be any known conventional device for generating or receiving data which can be modulated and transmitted via an antenna and the data receiving means 30 can be any known conventional device for receiving a stream of data.

While it is not necessary, the remote and local units 8 and 6 may each include a multiplexer (not shown) for sending and receiving signals between the units. The multiplexing scheme, however, will be relatively simple because the signals at this stage are low frequency and unmodulated.

What is claimed is:

1. A transceiver for transmitting a transmit signal and for receiving a receive signal, said transceiver comprising a remote unit and a local unit located away from said remote unit;

said remote unit comprising:

a frequency conversion section comprising a single, fixed-frequency local oscillator for up-converting an intermediate transmit signal to produce said transmit signal and for down-converting said receive signal to produce an intermediate receive signal;

a modulation section for modulating an intermediate frequency (IF) transmit data signal to produce said intermediate transmit signal and for demodulating said intermediate receive signal to produce a receive data signal of IF receive data frequency; and, said local unit comprising remote control means for separately controlling variation of modulation of said intermediate transmit signal and variation of demodulation of said intermediate receive signal in said modulation section.

2. The transceiver of claim 1 wherein said frequency conversion section comprises:

a transmit mixer for mixing said intermediate transmit signal with said carrier signal to thereby produce said transmit signal of transmit frequency; and a receive mixer for mixing said receive signal with said carrier signal to thereby produce said intermediate receive signal.

3. The transceiver of claim 2 wherein said modulation section comprises:

a transmit synthesizer controlled by said remote control means for generating a modulation signal of modulation frequency;

a transmit modulator for modulating said transmit data signal with said modulation signal to thereby produce said intermediate transmit signal;

a receive synthesizer controlled by said remote control means for generating a demodulation signal of demodulation frequency; and a receive demodulator for demodulating said intermediate receive signal with said demodulation signal to thereby produce said receive data signal of receive data frequency.

4. The transceiver of claim 4 wherein varying said modulation frequency changes data transmitted on said transmit signal and varying said demodulation frequency changes data received on said receive data signal.

5. The transceiver of claim 4 wherein said data transmitted contains selected transmit data channels such that varying said modulation frequency selectively changes said selected transmit data channels carried by said transmit signal, and wherein said data received contains selected receive data channels such that varying said demodulation signal selectively changes the selected receive data channels carried by said receive data signal.

6. The transceiver of claim 5 wherein said modulation frequency and said demodulation frequency are remotely controlled by said local unit.

7. The transceiver of claim 3 wherein varying said modulation frequency varies said transmit frequency and varying said demodulation frequency varies said receive data frequency.

8. The transceiver of claim 3 wherein the frequency of said intermediate receive signal and the frequency of said intermediate transmit signal are such that image responses and carriers are moved out of a the transmit signal band and a receive signal band.

9. A method of tuning a multi-stage transceiver at an intermediate frequency (IF) stage, said transceiver having a remote unit and a local unit, the method comprising the steps of:

(a) providing an IF transmit data signal containing selected transmit data and a receive signal carrying receive data, said transmit data signal generated by said local unit;

(b) modulating said transmit data signal with a modulation signal of controllable modulation frequency to thereby produce an intermediate transmit signal;

(c) up-converting said intermediate transmit signal by mixing it with a carrier signal of fixed carrier frequency from a first oscillator to thereby produce a transmit signal carrying selected plural transmit data channels;

(d) down-converting said receive signal by mixing it with the carrier signal of fixed carrier frequency from the first oscillator to thereby produce an intermediate receive signal;

(e) demodulating said intermediate receive signal with a demodulation signal of controllable demodulation frequency to thereby produce a receive data signal carrying selected receive data; and (f) separately controlling said demodulation frequency and said modulation frequency from said local unit whereby varying said modulation frequency changes a selection of said selected transmit data carried on said transmit signal and varying said demodulation frequency changes a selection of said selected receive data carried on said receive data signal.

10. The method of claim 9 wherein said modulating step further comprises the steps of:

(a) providing a transmit synthesizer for generating the modulation signal of said modulation frequency, the transmit synthesizer being located in the remote unit; and (b) controlling the transmit synthesizer from the local unit.

11. The method of claim 10 wherein said down conversion step further comprises the steps of:

(a) providing a receive synthesizer for generating the demodulation signal of said demodulation frequency, the receive synthesizer being located in the remote unit; and (b) controlling the receive synthesizer from the local unit.

12. A transceiver for transmitting and receiving signals, and having a remote unit and a local unit located away from said remote unit, said remote unit comprising:

means for receiving a receive signal having a carrier frequency;

a receive mixer operatively connected to said receiving means for downconverting said receive signal to an intermediate receive signal having an intermediate receive frequency;

a receive demodulator operatively connected to said receive mixer for demodulating said intermediate receive signal to a receive data signal having a intermediate frequency (IF) receive data frequency;

a receive synthesizer operatively connected to said receive demodulator for providing thereto a receive modulation signal of controllable receive modulation frequency;

a transmit modulator for modulating an IF transmit data signal to an intermediate transmit signal having an intermediate transmit frequency, and having means for receiving said transmit data frequency;

a transmit synthesizer operatively connected to said transmit modulator for providing thereto a transmit modulation signal of controllable transmit modulation frequency;

a transmit mixer for upconverting said intermediate transmit signal to a transmit signal to said carrier frequency;

a single phase-locked oscillator operatively connected to said receive mixer and said transmit mixer for providing said carrier frequency thereto; and means for transmitting said transmit signal operatively connected to said transmit mixer; and said local unit comprising:

a synthesizer controller operatively connected to said receive synthesizer and to said transmit synthesizer for selectively varying said demodulation frequency and for selectively varying said modulation frequency;

means for receiving said IF receive data signal from said receive modulator; and means for providing said IF transmit data signal to said transmit modulator.

13. The transceiver of claim 12 wherein said carrier frequency is about 10 GHz.

14. The transceiver of claim 13 wherein said intermediate receive frequency and said intermediate transmit frequency are each about 1 GHz.

15. The transceiver of claim 14 wherein said IF receive data frequency and said IF transmit data signal are each about 70 MHz.

* * * * *